(12) United States Patent
Abe

(10) Patent No.: US 11,490,511 B2
(45) Date of Patent: Nov. 1, 2022

(54) CIRCUIT BOARD AND ELECTRONIC DEVICE THAT INCLUDES IT

(71) Applicant: KYOCERA Corporation, Kyoto (JP)

(72) Inventor: Yuichi Abe, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 82 days.

(21) Appl. No.: 17/252,949

(22) PCT Filed: Jun. 27, 2019

(86) PCT No.: PCT/JP2019/025656
§ 371 (c)(1),
(2) Date: Dec. 16, 2020

(87) PCT Pub. No.: WO2020/004565
PCT Pub. Date: Jan. 2, 2020

(65) Prior Publication Data
US 2021/0161008 A1 May 27, 2021

(30) Foreign Application Priority Data
Jun. 28, 2018 (JP) .............................. JP2018-123306

(51) Int. Cl.
*H05K 1/03* (2006.01)
*H01L 23/15* (2006.01)

(52) U.S. Cl.
CPC ........... *H05K 1/0306* (2013.01); *H01L 23/15* (2013.01)

(58) Field of Classification Search
CPC ............... H05K 1/0306; H05K 1/0271; H05K 2201/0761; H05K 2201/09036; H05K 1/0256
USPC .......................................... 174/258
See application file for complete search history.

(56) References Cited

U.S. PATENT DOCUMENTS

| 5,819,858 A * | 10/1998 | Nechansky ............. H05K 3/02 174/250 |
| 8,658,908 B2 * | 2/2014 | Nakashima ............. H01L 24/97 361/816 |
| 2011/0315439 A1 | 12/2011 | Nakashima |

FOREIGN PATENT DOCUMENTS

| DE | 3431446 A1 | 3/1986 |
| JP | 2008-050209 A | 3/2008 |
| JP | 2015-177104 A | 10/2015 |
| WO | 2010/150820 A1 | 12/2010 |

* cited by examiner

*Primary Examiner* — Sherman Ng
(74) *Attorney, Agent, or Firm* — Procopio Cory Hargreaves and Savitch LLP

(57) ABSTRACT

A circuit board according to the present disclosure includes a substrate that is composed of a ceramic(s), and an electrically conductive layer that is positioned in contact with the substrate. The substrate includes a groove around the electrically conductive layer. Furthermore, an electronic device according to the present disclosure includes a circuit board with a configuration as described above, and an electronic component that is positioned on the electrically conductive layer.

8 Claims, 1 Drawing Sheet

CIRCUIT BOARD AND ELECTRONIC DEVICE THAT INCLUDES IT

CROSS-REFERENCE TO RELATED APPLICATION(S)

This application is a national stage application of International Application No. PCT/JP2019/025656 filed on Jun. 27, 2019, which designates the United States, the entire contents of which are herein incorporated by reference, and which is based upon and claims the benefit of priority to Japanese Patent Application No. 2018-123306 filed on Jun. 28, 2018, the entire contents of which are herein incorporated by reference.

FIELD

The present disclosure relates to a circuit board and an electronic device that includes it.

BACKGROUND

An electronic device has been known where various types of electronic components such as a semiconductor element, a heat generation element, or a Peltier element are mounted on an electrically conductive layer on a substrate of a circuit board.

Herein, a ceramic(s) with an excellent mechanical property and heat release property is/are adopted for a substrate of a circuit board that is used for such an electronic device (see, for example, Patent Literature 1).

CITATION LIST

Patent Literature

Patent Literature 1: Japanese Patent Application Publication No. 2008-050209

SUMMARY

A circuit board according to the present disclosure includes a substrate that is composed of a ceramic(s), and an electrically conductive layer that is positioned in contact with the substrate. Then, the substrate has a groove around the electrically conductive layer.

Furthermore, an electronic device according to the present disclosure includes the circuit board with a configuration as described above, and an electronic component that is positioned on the electrically conductive layer.

DESCRIPTION OF EMBODIMENTS

Figure 1:
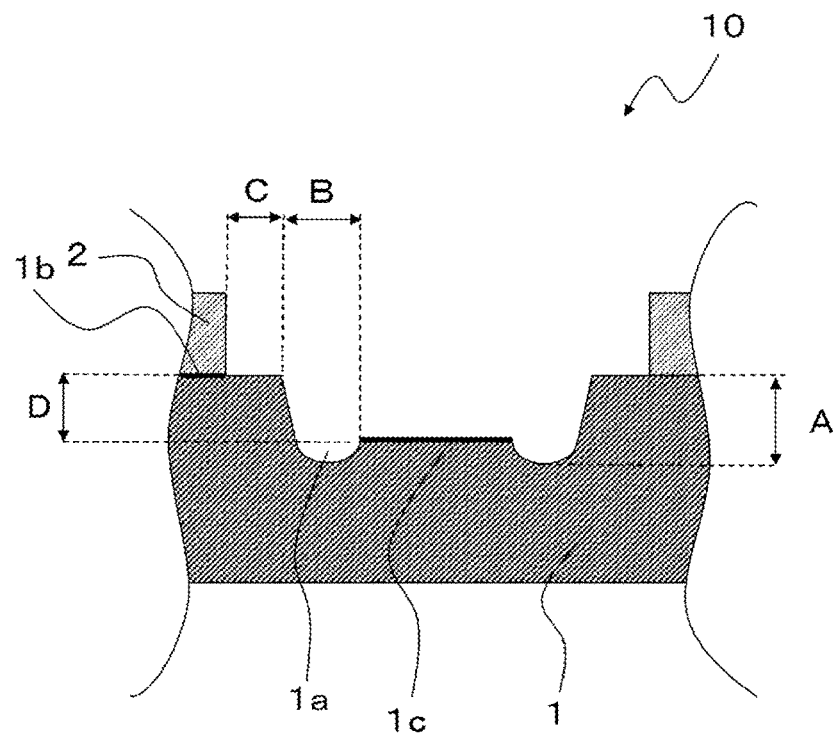
FIG. 1 is a cross-sectional view that schematically illustrates an example of a circuit board according to the present disclosure.

Hereinafter, a circuit board according to the present disclosure will be explained in detail, with reference to the drawing(s).

A circuit board 10 according to the present disclosure includes a substrate 1 that is composed of a ceramic(s) and an electrically conductive layer 2 that is positioned in contact with the substrate, as illustrated in FIG. 1.

Herein, it is possible to use, for example, a silicon carbide type ceramic(s), an aluminum oxide type ceramic(s), a silicon nitride type ceramic(s), an aluminum nitride type ceramic(s), a mullite type ceramic(s), or the like, as a ceramic(s) that compose(s) the substrate 1. Additionally, when the substrate 1 is composed of a nitride type ceramic(s) such as a silicon nitride type ceramic(s) or an aluminum nitride type ceramic(s), a thermal conductivity/conductivities of such a nitride type ceramic(s) is/are high, so that a heat release property thereof is excellent. Herein, for example, in an aluminum nitride type ceramic(s), aluminum nitride accounts for 70% by mass or greater of 100% by mass of all components that compose such an aluminum nitride type ceramic(s). Additionally, a similar matter also applies to another/other ceramic(s).

Then, it is possible to confirm a material of the substrate 1 according to a following method. First, measurement is executed by using an X-ray diffractometer (XRD) and a value of obtained $2\theta$ (where $2\theta$ is a diffraction angle) is identified by a JCPDS card, so that a component(s) of the substrate 1 is/are identified. Then, quantitative analysis of the substrate 1 is executed by using an ICP (Inductively Coupled Plasma) emission spectrophotometer (ICP). Herein, if a component that is identified by an XRD is aluminum nitride and a value that is provided by converting a content of aluminum (Al) that is measured by an ICP into that of aluminum nitride (AlN) is 70% by mass or greater, it is an aluminum nitride type ceramic(s).

Then, in the circuit board 10 according to the present disclosure, the substrate 1 has a groove 1a around the electrically conductive layer 2. Herein, "around an electrically conductive layer 2" refers to a range of 100 µm or less from an outer circumference of the electrically conductive layer 2. Furthermore, the groove 1a is a recess that has a length of 50 µm or greater in a top view thereof. Additionally, a top view herein is a plan view of a surface of the substrate 1 that has the electrically conductive layer 2.

As such a configuration is satisfied, a creeping distance between adjacent electrically conductive layers 2 is increased by presence of the groove 1a that is positioned around the electrically conductive layers 2, so that the circuit board 10 according to the present disclosure has an excellent insulation resistance.

Herein, a depth of the groove 1a may be, for example, 5 µm or greater and 30 µm or less. Additionally, a depth of the groove 1a is an average value of a shortest distance A from a deepest place of the groove 1a to an imaginary plane that passes through a first region 1b that is a place that contacts the electrically conductive layer 2 on the substrate 1, in a cross-sectional view thereof, as illustrated in FIG. 1A. Additionally, a cross-sectional view herein is a plan view of a cutting plane when the circuit board 10 is cut in a direction that is orthogonal to a direction where the groove 1a extends, as illustrated in FIG. 1. In particular, if a depth of the groove 1a is 10 µm or less, a crack is not readily generated even if thermal stress is caused by heat generation of the electrically conductive layer 2.

Furthermore, a width of the groove 1a may be, for example, 5 µm or greater and 30 µm or less. Additionally, a width of the groove 1a is an average value of a shortest distance B from one edge to another edge of the groove 1a that is parallel to the first region 1b in a cross-sectional view thereof, as illustrated in FIG. 1.

Furthermore, in the circuit board 10 according to the present disclosure, the groove 1a may surround an outer circumference of the electrically conductive layer 2. Herein, "surround(s) an outer circumference of an electrically conductive layer 2" refers to, for example, the groove 1a with a ring shape that surrounds the electrically conductive layer 2.

If such a configuration is satisfied, the groove 1a is present in such a manner that, even if an imaginary line extends in a particular direction from the electrically conductive layer 2 in a top view thereof, such an imaginary line necessarily intersects with the groove 1a, so that a insulation resistance of the circuit board 10 according to the present disclosure is improved.

Furthermore, in the circuit board 10 according to the present disclosure, the groove 1a may be along an outer circumference of the electrically conductive layer 2. Herein, "along an outer circumference of an electrically conductive layer 2" refers to the groove 1a that extends so as to be parallel to an outer circumference of the electrically conductive layer 2.

If such a configuration is satisfied, concentration of lines of electric force that generate from the electrically conductive layer 2 is relaxed by presence of the groove 1a, so that occurrence of a discharge phenomenon is prevented or reduced. Hence, the circuit board 10 according to the present disclosure is excellent in reliability.

Moreover, in the circuit board 10 according to the present disclosure, an average distance from an outer circumference of the electrically conductive layer 2 to the groove 1a may be 5 μm or greater and 40 μm or less. Herein, an average distance from an outer circumference of the electrically conductive layer 2 to the groove 1a is an average value of a shortest distance C from an end of the electrically conductive layer 2 on a side of the substrate 1 to the groove 1a, as illustrated in FIG. 1.

If such a configuration is satisfied, concentration of lines of electric force is effectively relaxed by presence of the groove 1a, so that the circuit board 10 according to the present disclosure is more excellent in reliability.

Furthermore, when a place that contacts the electrically conductive layer 2 on the substrate 1 of the circuit board 10 according to the present disclosure is provided as the first region 1b and a place that is distant from the first region 1b by interposing the groove 1a therebetween is provided as a second region 1c, the first region 1b may be higher than the second region 1c. Herein, each of the first region 1b and the second region 1c is indicated by a thick line in FIG. 1. Herein, height comparison is executed in a thickness direction of the substrate 1.

If such a configuration is satisfied, it is possible to further increase a creeping distance, so that an insulation resistance of the circuit board 10 according to the present disclosure is improved. Herein, a distance from the first region 1b to the second region 1c may be, for example, 5 μm or greater and 30 μm or less. Additionally, a distance from the first region 1b to the second region 1c is an average value of a shortest distance D from an imaginary plane that passes through the first region 1b to an imaginary plane that passes through the second region 1c, as illustrated in FIG. 1.

Herein, it is sufficient that a depth of the groove 1a, a width of the groove 1a, an average distance from an outer circumference of the electrically conductive layer 2 to the groove 1a, and a distance from the first region 1b to the second region 1c are measured and calculated according to a following method. First, the circuit board 10 is cut so as to provide a cross-sectional shape as illustrated in FIG. 1, polishing thereof is executed by using a cross section polisher (CP) so as to obtain a polished surface, and a photograph of such a polished surface is taken. Then, each of shortest distances A to D is measured on such a photograph. Then, it is sufficient that such an operation is repeated three times for different polished surfaces and an average value thereof is obtained.

Figure 2:
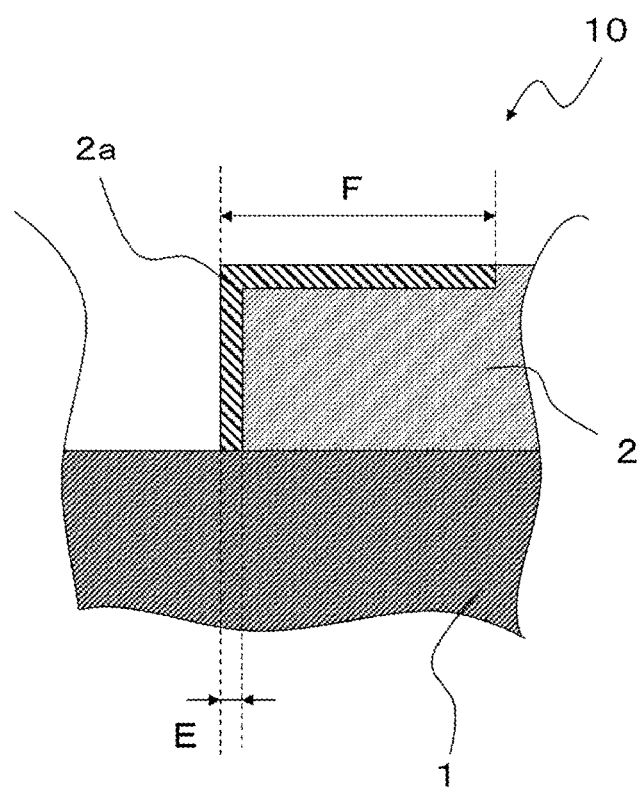
FIG. 2 is a partial cross-sectional view that schematically illustrates an example of a circuit board according to the present disclosure.

Furthermore, FIG. 2 is a partial cross-sectional view that schematically illustrates an example of a circuit board according to the present disclosure. A circuit board 10 according to the present disclosure may have a carbide layer, a nitride layer, or an oxide layer 2a from an outer circumference of an electrically conductive layer 2 toward an inside thereof.

If such a configuration is satisfied, a volume intrinsic resistivity of the carbide layer, nitride layer, or oxide layer 2a is higher than that of the electrically conductive layer 2. Hence, the circuit board 10 according to the present disclosure has a high insulation resistance. Herein, a thickness E of the carbide layer, nitride layer, or oxide layer 2a may be 0.2 μm or greater and 3 μm or less. Furthermore, the carbide layer, nitride layer, or oxide layer 2a may be positioned within a range of a distance F from an outer circumference of the electrically conductive layer 2 to 50 μm inward.

Herein, the carbide layer, nitride layer, or oxide layer 2a that is possessed by the electrically conductive layer 2 may be confirmed according to a following method. First, the circuit board 10 is cut so as to provide a cross-sectional shape as illustrated in FIG. 1 and polishing thereof is executed by using a CP so as to obtain a polished surface. Then, while such a polished surface is provided as an observation surface, a component(s) that compose(s) the electrically conductive layer 2 may be measured by using an energy dispersive X-ray analyzer (EDS) that is attached and provided to a scanning electron microscope (SEM) so as to obtain a region where carbon (C), nitrogen (N), or oxygen (O) is present and measure a thickness E and/or a distance F. Furthermore, etching from a foremost surface of the electrically conductive layer 2 may be executed by an argon beam or the like so as to provide a definition based on a thickness of a region where carbon (C), nitrogen (N), or oxygen (O) is present by using an Auger electron spectroscopy analyzer.

Furthermore, an arithmetic mean roughness Ra of a second region 1c of the circuit board 10 according to the present disclosure that is obtained by a roughness curve may be 0.15 μm or greater. If such a configuration is satisfied, it is possible to further increase a creeping distance, so that an insulation resistance of the circuit board 10 according to the present disclosure is improved.

Furthermore, an arithmetic mean roughness Ra of a first region 1b may be, for example, 0.1 μm or less.

Furthermore, a ratio Ra1/Ra2 of an arithmetic mean roughness Ra1 in a direction that is orthogonal to a direction where the groove 1a extends to an arithmetic mean roughness Ra2 in a direction that is parallel to the direction where the groove 1a extends, in the second region 1c, may be greater than 1.

Herein, it is sufficient that arithmetic mean roughnesses Ra of the second region 1c and the first region 1b are calculated by executing measurement on at least three or more points in each of the second region 1c and the first region 1b by using a contact-type surface roughness meter in conformity with JIS B 0601 (2013) and obtaining an average value thereof. Additionally, in a case where the first region 1b is measured, measurement is executed after the electrically conductive layer 2 is eliminated by etching or the like so as to expose the first region 1b. Furthermore, for a measurement condition(s), it is sufficient that a measurement length is 2.5 mm, a cutoff value is 0.8 mm, a probe with a probe radius of 2 μm is used, and a scanning rate is set at 0.6 mm/sec.

Furthermore, while it is sufficient that the electrically conductive layer 2 is composed of a material that has an electrically conductive property, at least one of titanium, nickel, molybdenum, tungsten, silver, copper, palladium, platinum, and gold may be provided as a main component thereof. Herein, "at least one of titanium, nickel, molybdenum, tungsten, silver, copper, palladium, platinum, and gold is provided as a main component thereof" is that at least one of titanium, nickel, molybdenum, tungsten, silver, copper, palladium, platinum, and gold is 80% by mass or greater of 100% by mass of all components that compose the electrically conductive layer 2. Thus, if a main component of the electrically conductive layer 2 is at least one of titanium, nickel, molybdenum, tungsten, silver, copper, palladium, platinum, and gold, an electrical conductivity thereof is high, so that reliability of the circuit board 10 according to the present disclosure is improved. In particular, in a case where the electrically conductive layer 2 contains gold, a corrosion resistance of gold to a corroding gas is high, so that reliability of the circuit board 10 according to the present disclosure is further improved under an environment that uses such a corroding gas. Furthermore, in a case where the electrically conductive layer 2 contains titanium, a living body affinity thereof is high, so that it is possible to use the circuit board 10 according to the present disclosure as a member for living body implant.

Herein, it is sufficient that a component(s) that compose(s) the electrically conductive layer 2 and a content(s) thereof are confirmed according to a following method. First, the circuit board 10 is cut so as to provide a cross-sectional shape as illustrated in FIG. 1 and polishing is executed by using a CP so as to obtain a polished surface. Then, it is sufficient that, while such a polished surface is provided as an observation surface, a component(s) that compose(s) the electrically conductive layer 2 and a content(s) thereof are measured by using an energy dispersive X-ray analyzer (EDS) that is attached and provided to a scanning electron microscope (SEM). Alternatively, the electrically conductive layer 2 may be scraped off, so as to measure a component(s) that compose(s) the electrically conductive layer 2 and a content(s) thereof by using an ICP or an X-ray fluorescence spectrometer (XRF).

Furthermore, an electronic device according to the present disclosure includes the circuit board 10 with a configuration as described above and an electronic component that is positioned on the electrically conductive layer 2 of the circuit board 10. Thus, an electronic device according to the present disclosure includes the circuit board 10 with a configuration as described above, and hence, is excellent in reliability.

Herein, for an electronic component, it is possible to use, for example, a semiconductor element such as a light-emitting diode (LED) element, an insulated gate bipolar transistor (IGBT) element, an intelligent power module (IPM) element, a metal-oxide semiconductor field-effect transistor (MOSFET) element, a free-wheeling diode (FWD) element, a giant transistor (DTR) element, or a Schottoky barrier diode (SBD), a heat generation element for a sublimation thermal printer head or a thermal ink-jet printer head, a Peltier element, or the like.

Hereinafter, an example of a manufacturing method for a circuit board 10 according to the present disclosure will be explained.

First, for a substrate 1, a ceramic(s) such as, for example, an aluminum nitride type ceramic(s) or an aluminum oxide type ceramic(s) is/are prepared by a publicly known molding method and firing method. Additionally, a thickness of the substrate 1 may be, for example, 0.15 mm or greater and 1.5 mm or less.

Then, a fabrication method for an electrically conductive layer 2 will be explained. First, a surface of the substrate 1 is polished by lap processing. As such lap processing is executed, it is possible to adjust an arithmetic mean roughness Ra of a first region 1b to any value.

Then, a thin film of titanium, chromium, nickel, and palladium is formed on the substrate 1 by sputtering. Herein, an average film thickness of such a thin film may be, for example, 0.03 μm or greater and 20 μm or less. Then, an electrically conductive part that is composed of at least one of titanium, nickel, molybdenum, tungsten, silver, copper, palladium, platinum, and gold is formed on a thin film as described above by sputtering. Herein, an average film thickness of such an electrically conductive part may be, for example, 1 μm or greater and 20 μm or less.

Then, a part of an obtained thin film and electrically conductive part is scraped off by a laser, so as to form the electrically conductive layer 2. Thereby, a place where such an electrically conductive part is scraped off by a laser is provided as a groove 1a or a second region 1c, so as to obtain the circuit board 10 according to the present disclosure. Additionally, as an output, a sweep speed, a sweep direction, or the like of a laser is controlled, it is possible to adjust a depth of the groove 1a, a width of the groove 1a, a distance from an outer circumference of the electrically conductive layer 2 to the groove 1a, a distance from the first region 1b to the second region 1c, or an arithmetic mean roughness Ra of the second region 1c to any value. Furthermore, in order that the circuit board 10 has a carbide layer, nitride layer, or oxide layer 2a from an outer circumference of the electrically conductive layer 2 toward an inside thereof, a laser processing surface is needed to be a highly active state, where it is sufficient that non-thermal processing is executed by using a nanosecond pulsed laser, a picosecond pulsed laser, or a femtosecond pulsed laser. Furthermore, in a case where processing is executed in a $CO_2$ gas atmosphere or a case where processing is executed in air, an electrically conductive layer reacts with dust that is present in air so as to produce a carbide layer. In a case where processing is executed in a nitrogen atmosphere, an electrically conductive layer reacts with a nitrogen gas so as to generate a nitride layer, and in a case where processing is executed in an atmospheric air, an electrically conductive layer reacts with oxygen in such an atmospheric air so as to generate an oxide layer. Additionally, such a region may have all of a carbide layer, a nitride layer, or an oxide layer.

Additionally, if a substrate 1 is used where divided grooves are formed, it is possible to form multiple circuit boards 10. Furthermore, a penetration conductor may be formed by forming a through-hole on a substrate 1 and subsequently executing filling with an electrically conductive component by a publicly known plating method, printing paste method, sputtering method, or the like, so as to provide a circuit board 10 that is capable of executing conduction on a front and a back thereof. Furthermore, a surface of an electrically conductive layer 2 may be coated with a coating layer that is composed of at least one kind that is selected from silver, copper, nickel, palladium, and gold, by a publicly known plating method.

Next, an example of a manufacturing method for an electronic device according to the present disclosure will be explained. First, a circuit board 10 that is obtained by a manufacturing method as described above is prepared and an electronic component is packaged on an electrically conductive layer 2, so as to obtain an electronic device according to the present disclosure.

It is possible for a person(s) skilled in the art to readily derive an additional effect(s) and/or variation(s). Hence, a broader aspect(s) of the present invention is/are not limited to a specific detail(s) and a representative embodiment(s) as illustrated and described above. Therefore, various modifications are possible without departing from the spirit or scope of a general inventive concept that is defined by the appended claim(s) and an equivalent(s) thereof.

REFERENCE SIGNS LIST

1: substrate
1a: groove
1b: first region
1c: second region
2: electrically conductive layer
10: circuit board

The invention claimed is:

1. A circuit board, comprising:
 a substrate that is composed of a ceramic(s); and
 an electrically conductive layer that is positioned in contact with the substrate, wherein
 the substrate includes a groove around the electrically conductive layer, wherein the groove has a width of 5 µm or greater and 30 µm or less.

2. The circuit board according to claim 1, wherein the groove surrounds an outer circumference of the electrically conductive layer.

3. The circuit board according to claim 1, wherein the groove is along an outer circumference of the electrically conductive layer.

4. The circuit board according to claim 3, wherein an average distance from an outer circumference of the electrically conductive layer to the groove is 5 µm or greater and 40 µm or less.

5. The circuit board according to claim 1, wherein, when a place that contacts the electrically conductive layer on the substrate is provided as a first region and a place that is distant from the first region by interposing the groove therebetween is provided as a second region, the first region is higher than the second region.

6. The circuit board according to claim 1, further comprising a carbide layer, a nitride layer, or an oxide layer from an outer circumference of the electrically conductive later toward an inside thereof.

7. The circuit board according to claim 5, wherein an arithmetic mean roughness Ra of the second region that is obtained from a roughness curve is 0.15 µm or greater.

8. An electronic device, comprising:
 the circuit board according to claim 1; and
 an electronic component that is positioned on the electrically conductive layer.

* * * * *